United States Patent
Convertino et al.

(10) Patent No.: US 11,201,246 B2
(45) Date of Patent: Dec. 14, 2021

(54) FIELD-EFFECT TRANSISTOR STRUCTURE AND FABRICATION METHOD

(71) Applicant: International Business Machines Corporation, Armonk, NY (US)

(72) Inventors: Clarissa Convertino, Zurich (CH); Cezar Bogdan Zota, Zurich (CH); Kirsten Emilie Moselund, Zurich (CH); Lukas Czornomaz, Zurich (CH); Davide Cutaia, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/681,225

(22) Filed: Nov. 12, 2019

(65) Prior Publication Data

US 2021/0143282 A1    May 13, 2021

(51) Int. Cl.
| | |
|---|---|
| *H01L 29/786* | (2006.01) |
| *H01L 29/66* | (2006.01) |
| *H01L 29/08* | (2006.01) |
| *H01L 29/40* | (2006.01) |
| *H01L 21/8234* | (2006.01) |

(52) U.S. Cl.
CPC ........ *H01L 29/78642* (2013.01); *H01L 21/823487* (2013.01); *H01L 29/0847* (2013.01); *H01L 29/401* (2013.01); *H01L 29/6653* (2013.01); *H01L 29/66742* (2013.01); *H01L 29/66787* (2013.01)

(58) Field of Classification Search
CPC .......... H01L 29/66787; H01L 21/823487
See application file for complete search history.

(56) References Cited

U.S. PATENT DOCUMENTS

| | | |
|---|---|---|
| 8,368,127 B2 | 2/2013 | Zhu et al. |
| 8,697,510 B2 | 4/2014 | Bhuwalka et al. |
| (Continued) | | |

FOREIGN PATENT DOCUMENTS

WO    2018063302 A1    4/2018

OTHER PUBLICATIONS

Avci et al., "Tunnel Field-Effect Transistors: Prospects and Challenges," Journal of the Electron Devices Society, vol. 3, No. 3, May 2015, pp. 88-95.

(Continued)

*Primary Examiner* — Farun Lu
(74) *Attorney, Agent, or Firm* — Jorge R. Maranto

(57) ABSTRACT

The present disclosure relates to a method for fabricating an FET structure. The method includes forming on a substrate a first semiconductor structure and an insulator structure covering the first semiconductor structure with a first insulator layer, forming on the first insulator layer a sacrificial layer extending to a reference plane, forming a second insulator layer on the reference plane, forming a first cavity through the second insulator layer, the sacrificial layer and the first insulator layer, thus exposing a surface of the first semiconductor structure, filling the first cavity with a second semiconductor structure extending from the surface at least up to the first reference plane, forming a third semiconductor structure on the second semiconductor structure, selectively removing the sacrificial layer, thus forming a second cavity, and filling the second cavity with a gate structure.

17 Claims, 5 Drawing Sheets

(56) References Cited

U.S. PATENT DOCUMENTS

| | | | |
|---|---|---|---|
| 9,530,863 | B1 | 12/2016 | Zhang et al. |
| 9,640,667 | B1* | 5/2017 | Balakrishnan ........ H01L 29/201 |
| 9,722,048 | B1* | 8/2017 | Balakrishnan .... H01L 29/41766 |
| 9,806,172 | B2 | 10/2017 | Chuang et al. |
| 10,236,344 | B2 | 3/2019 | Alptekin et al. |
| 10,388,772 | B2 | 8/2019 | Liu |
| 10,529,860 | B2 | 1/2020 | Chen |
| 2006/0043498 | A1 | 3/2006 | Orlowski |
| 2010/0038713 | A1 | 2/2010 | Majhi et al. |
| 2011/0253981 | A1 | 10/2011 | Rooyackers et al. |
| 2011/0278670 | A1 | 11/2011 | Loh et al. |
| 2012/0326168 | A1 | 12/2012 | Adam |
| 2014/0145246 | A1 | 5/2014 | Ning |
| 2015/0243707 | A1* | 8/2015 | Park .................... H01L 29/7391 257/2 |
| 2015/0287826 | A1 | 10/2015 | Cheng |
| 2016/0056033 | A1 | 2/2016 | Sardashti |
| 2017/0125544 | A1 | 5/2017 | Leobandung |
| 2017/0162446 | A1* | 6/2017 | Balakrishnan ...... H01L 21/3081 |
| 2018/0190802 | A1 | 7/2018 | Yang et al. |
| 2018/0269329 | A1* | 9/2018 | Balakrishnan ...... H01L 29/7889 |

OTHER PUBLICATIONS

Schenk et al., "The Impact of Hetero-junction and Oxide-interface Traps on the Performance of InAs/Si FETs," 17th International Workshop on Junction Technology (IWJT), Jun. 2017, pp. 27-30.

Chattopadhyay et al., "Impact of a Spacer Dielectric and a Gate Overlap/Underlap on the Device Performance of a Tunnel Field-Effect Transistor," IEEE Transactions on Electron Devices, vol. 58, No. 3, Mar. 2011, pp. 677-683.

Memisevic et al., "Vertical InAs/GaAsSb/GaSb Tunneling Field-Effect Transistor on Si with S = 48 mV/decade and Ion = 10 μA/μm for Ioff = 1 nA/μm at VDS = 0.3 V," IEEE International Electron Devices Meeting (IEDM), Dec. 2016, pp. 1-4.

Convertino et al., "Field-Effect Transistor Structure and Fabrication Method," U.S. Appl. No. 16/681,141, filed Nov. 12, 2019.

List of IBM Patents or Patent Applications Treated as Related, Signed Nov. 12, 2019, 2 pages.

* cited by examiner

FIELD-EFFECT TRANSISTOR STRUCTURE AND FABRICATION METHOD

BACKGROUND

The present disclosure relates to semiconductor devices, and more particularly, to field-effect transistors and methods for producing the same.

The previous decades have seen a continuous effort of scaling the dimensions of microelectronics down to ever smaller technology nodes. This scaling is accompanied by power scaling toward more energy-efficient microelectronics.

The current-voltage (I-V) curves of classical MOSFET devices feature a so-called subthreshold swing with a slope of approximately 60 millivolts per decade (mV/dec) at 300 Kelvin (K) or more. The subthreshold leakage current responsible for the subthreshold swing is a major contributor to the off-state current and therefore sets a lower limit to the power consumption of such devices. As the value of 60 mV/dec is a fundamental lower limit for MOSFETs implementing thermal charge carrier generation, the power design of these devices cannot be scaled beyond this limit. Furthermore, the subthreshold swing is proportional to the transistor speed: The lower the subthreshold swing, the faster a transistor will be able to charge its fan-out (consecutive capacitive load).

Modern FETs are often built with a self-aligned gate, where the gate structure itself is used as a mask for the doping of the source and drain regions. Conventional gate self-alignment leads to a slight overlap of the gate structure with the edges of the source and drain regions. This reduces the FET's series resistance, but also introduces additional so-called parasitic capacitances into circuitry utilizing such FETs. A self-aligned process is considered useful for the ability to scale dimensions while maintaining a high performance for MOSFETs.

SUMMARY

Embodiments of the present disclosure include a method for fabricating a field-effect transistor structure on a substrate. The method includes forming a starting structure on the substrate, the starting structure comprising a first semiconductor structure and an insulator structure, the insulator structure covering the first semiconductor structure with a first insulator layer and forming a sacrificial layer on the first insulator layer. The sacrificial layer extends between the first insulator layer and a first reference plane. The method also includes forming a second insulator layer on the first reference plane, forming a first cavity through the second insulator layer, the sacrificial layer and the first insulator layer, thus exposing a first exposed surface of the first semiconductor structure, filling the first cavity with a second semiconductor structure at least up to the first reference plane, thus covering the first exposed surface with the second semiconductor structure, the second semiconductor structure having a second exposed surface, and forming a third semiconductor structure on the second exposed surface. The method further includes selectively removing the sacrificial layer, thus forming a second cavity and exposing a third exposed surface of the second semiconductor structure, and filling the second cavity with a gate structure, thus covering the third exposed surface with the gate structure.

In a further aspect, embodiments of the present disclosure relate to a field-effect transistor structure formed on a substrate. The field-effect transistor structure includes a first semiconductor structure covered by a first insulator layer of an insulator structure, a gate structure extending between the first insulator layer and a first reference plane, a second insulator layer formed on the first reference plane, a second semiconductor structure formed on the first semiconductor structure and extending through the first insulator layer, the gate structure and the second insulator layer at least up to the reference plane, and a third semiconductor structure formed on the second semiconductor structure.

BRIEF DESCRIPTION OF THE DRAWINGS

These and other features, aspects, and advantages of the embodiments of the disclosure will become better understood with regard to the following description, appended claims, and accompanying drawings where:

Figure 1:
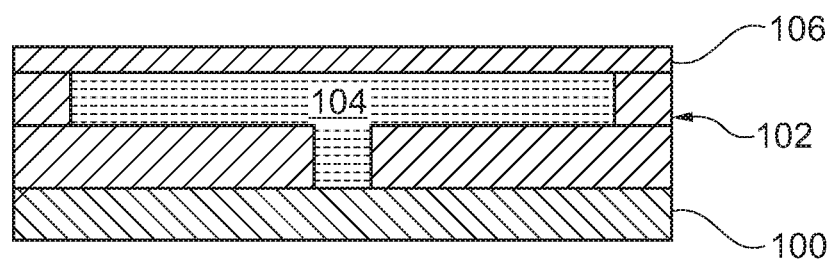
FIGS. 1-8 are cross-sectional views of an exemplary field-effect transistor structure at fabrication stages constructed according to the method of FIG. 11, accordance with embodiments of the present disclosure.

While the present disclosure is amenable to various modifications and alternative forms, specifics thereof have been shown by way of example in the drawings and will be described in detail. It should be understood, however, that the intention is not to limit the particular embodiments described. On the contrary, the intention is to cover all modifications, equivalents, and alternatives falling within the scope of the present disclosure. Like reference numerals are used to designate like parts in the accompanying drawings.

DETAILED DESCRIPTION

Embodiments of the disclosure may have the advantage of allowing a simultaneous fine control over the thicknesses of several structural components of the field-effect transistor (FET) structure. For instance, depending on the geometry of the first semiconductor structure, the finite thickness of the first insulator layer may ensure that there is no overlap between the first semiconductor structure and the gate structure. It may be possible to control the electrostatic interaction between the first semiconductor structure and the gate structure by choosing the thickness of the first insulator layer that defines the distance between the first semiconductor structure and the gate structure.

Likewise, depending on the geometry of the third semiconductor structure, the finite thickness of the second insulator layer may ensure that there is no overlap between the third semiconductor structure and the gate structure. It may be possible to control the electrostatic interaction between the third semiconductor structure and the gate structure by choosing the thickness of the second insulator layer that defines the distance between the gate structure and any portions of the third semiconductor structure overfilling the first cavity.

It may be possible for the FET structure to come closer to the theoretical limit of a subthreshold slope of 60 millivolts per decade (mV/dec) at 300 Kelvin (K) if the FET structure implements a MOSFET with thermal charge carrier generation, or respectively, to obtain a 'sub-thermal' subthreshold slope of less than 60 mV/dec if the FET structure implements a tunnel field-effect transistor (TFET) device featuring charge carrier injection by tunneling. This has been confirmed by simulations of TFET devices conducted at ETH Zurich and is also consistent with recent experimental results that indicate that the subthreshold swing reacts sensitively to the position of the tunnel junction. A reduction of the subthreshold swing is expected to lead to a higher switching speed and a lower power consumption of such TFET devices. The most promising results were simulated for devices with a source-gate overlap of 0 nanometers (nm).

Moreover, it may be possible to manufacture the FET structure with an underlap, i.e., an ungated region of channel of, e.g., a few to a few tens of nanometers adjacent to either the source or the drain. This may be advantageous, e.g., on the drain side of a TFET to reduce the leakage current caused by ambipolar transport. In summary, it may be possible to design the FET structure so as to implement an FET or a TFET with a source-gate and/or drain-gate geometry having an overlap of 0 nm or an underlap.

Embodiments of the disclosure may have the further advantage of offering an increased flexibility of material choice because it may be possible to form some or all of the structures described herein independent of the particular choice of material for one or more of the structures incorporated by the FET structure.

The second semiconductor structure may be formed inside the first cavity utilizing a crystal growth process. This may allow for precisely controlling the thickness of the second semiconductor structure, i.e., its extension between the first semiconductor structure and the third semiconductor structure. In this way, the distance between the gate structure and the third semiconductor structure may also be fine-tuned. It shall be noted that the second semiconductor structure extends inside the first cavity from and adjoining the first exposed surface at least to the first reference plane. In other words, the smallest distance between the first exposed surface and the second exposed surface is greater than or equal to the smallest distance between the first exposed surface and the first reference plane. The third semiconductor structure may be formed on the second exposed surface by a growth process and/or a deposition process. The particular choice of the manufacturing method of the third semiconductor structure may depend on the position of the second exposed surface.

The first cavity may be formed by a process involving lithographic patterning and etching that is capable of removing the layers formed on the first semiconductor structure (namely the first insulator layer, the sacrificial layer, and the second insulator layer) without (substantially) affecting the first semiconductor structure. This may allow a precise alignment between the first semiconductor structure and the second semiconductor structure without creating an overlap between them. Without limitation, the first cavity may have a constant cross-sectional area measured in a plane parallel to the first reference plane. During operation of the FET structure, this may ensure a constant electric field density across the second semiconductor structure when the gate structure is biased and may enable a constant current density along the second semiconductor structure.

Moreover, embodiments of the disclosure may reduce the processing complexity for fabricating an FET structure since each used material may be processed independently.

The method for fabricating a field-effect transistor structure on a substrate may utilize any suitable process known from semiconductor microfabrication, including, but not limited to, thin film deposition techniques such as chemical or physical vapor deposition or thermal oxidation, crystal growth techniques such as epitaxy, patterning techniques such as photolithography, and etching techniques such as wet or dry etching, doping techniques such as thermal diffusion or ion implantation, planarization techniques such as chemical-mechanical planarization (CMP), cleaning techniques, wire-bonding techniques, and the like.

The sequence formed by the first semiconductor structure adjoining the second semiconductor structure adjoining the third semiconductor structure may enable to implement a source-channel-drain structure that is typical for FET devices. In this sequence, the second semiconductor structure may implement a channel structure while the first semiconductor structure may implement either the source structure or the drain structure and the third semiconductor structure may implement the drain structure if the first semiconductor structure was chosen to implement the source structure or the third semiconductor structure may implement the source structure if the first semiconductor structure was chosen to implement the drain structure.

However, it should be noted that designations like "source", "gate" and "drain" denote the intended usage of such sequential semiconductor structure that is to be considered apart from the structure itself. Also, the sequence of the first semiconductor structure adjoining the second semiconductor structure adjoining the third semiconductor structure may implement any other semiconductor device or microstructure, even if it is not intended to be used as an FET, where it is desirable to have a clear detachment between the first semiconductor structure and the gate-structure equivalent as well as between the third semiconductor structure and the gate-structure equivalent while the second semiconductor structure forms said sequence with the first semiconductor structure and the third semiconductor structure. In this non-FET case, self-alignment may also imply structural control so that the position of the junctions between the first/second and second/third semiconductor can be chosen so as to be either slightly underlapping the gate-structure equivalent or so that they extend into the first cavity and possibly overlap with the gate-structure equivalent.

The FET structure comprises several structural units referred to as "structure" or "structures". These structures may be characterized by a specific material class such as "semiconductor structure", "insulator structure", "metal structure", but it may also be possible that they are characterized by their function, such as in "gate structure". Each of such structural units are to be understood as a volume comprising one or more materials of the specified class, if applicable. For instance, the first semiconductor structure may comprise one, two or more semiconductor materials as specified herein. The boundaries of one such structure, even if it comprises multiple materials, relative to any other adjoining structure are defined by a unity of function for which such structure is designed. In the example given before, the first semiconductor structure may be the source structure of the FET structure. In another example, the term "gate structure" refers to a heterostructure comprising a conductive gate electrode (e.g., made of a metal) and an insulating barrier detaching the gate electrode from the walls of the second cavity.

The present disclosure may refer to the material or material combination used to form the first/second/third semiconductor structure as the first/second/third semiconductor material, respectively; the material or material combination used to form the first/second/third insulator layer as the first/second/third insulator material, respectively; the material or material combination used to form the sacrificial layer as the placeholder material; and the material or material combination used to form the gate structure as the gate material.

Each semiconductor structure may be made of a pure (undoped) semiconductor, an intrinsic semiconductor (i-type, doped or undoped, having an equal number of excited electrons, n, and holes, p), or a doped semiconductor (having a dopant concentration of $10^{18}$ cm$^{-3}$ or less). Each insulating (non-conducting) barrier layer may be made of a material whose electrical conductivity cannot be increased using technologies such as doping or gating. In this sense, semiconductor materials differing only by their dopant or dopant concentration are to be considered as different materials. For instance, the compositions of the second semiconductor structure and the third semiconductor structure may comprise the same pure semiconductor as their respective most abundant material, but the second semiconductor structure and the third semiconductor structure may differ in their dopant material or dopant concentration, and hence they are made of different semiconductor materials. Two or all of the first, second and third semiconductor materials may share an equal most abundant material.

The first and the second insulator material may be equal, but it may alternatively be advantageous to choose different materials as the first and second insulator materials depending on e.g. the crystallographic properties of any adjoining materials to improve lattice matching. Without limitation, the first and the second insulator material may be oxides.

The placeholder material is different from the materials of any surrounding structures and allows for a selective response to etching, either by chemistry (i.e., only the placeholder material may react to a specifically chosen etchant while all other materials exposed to the etchant do not react with the etchant) or by concentration (the placeholder material may respond to a lower concentration of a given etchant than all other materials exposed to the etchant, or the placeholder material may respond to the etchant by a higher etch rate than the other materials used). In any case, the etching behavior of the placeholder material allows for a sole removal of the sacrificial layer while any other structures of the FET structure formed so far remain substantially intact so that the removal of the sacrificial layer does not deteriorate their respective functions. Without limitation, the placeholder material may be silicon dioxide ($SiO_2$) or silicon nitride (SiN), or more generally, any other oxide, insulating, or organic material that meets the individual requirements of etch selectivity and/or selectivity of nucleation during the growth of the second semiconductor structure.

The gate structure may comprise a gate electrode made of a conducting material such as titanium nitride (TiN) or a metal such a tungsten (W). The gate structure may further comprise a gate insulator that is made of a gate insulator material and interfaces the gate electrode and at least the second semiconductor structure. The gate insulator material may be, without limitation, an oxide such as aluminum oxide ($Al_2O_3$) or a high-k dielectric such as hafnium dioxide ($HfO_2$).

The term "exposed surface" refers to the surface that is not covered by material in a given fabrication stage. The exposed surface can be partially or fully covered by material during a following fabrication stage. It does not refer to a specific position of the surface.

The starting structure comprises an adjoining pair formed by the insulator structure and the first semiconductor structure. The starting structure is formed on the substrate and at least the insulator structure is adjoining the substrate. In case the first semiconductor structure is not contacting the substrate, the FET structure may comprise means for electrically contacting the first semiconductor structure to enable an application of a bias voltage to the first semiconductor structure and thus facilitate forming the second semiconductor structure by crystal growth. The insulator structure comprises a first insulator layer covering the first semiconductor structure.

According to an embodiment, the filling of the first cavity comprises overfilling the first cavity with the second semiconductor structure. Hence, the second semiconductor structure extends beyond the second insulator layer and the second exposed surface is located outside the first cavity. As it may be possible that the portion of the second semiconductor structure exceeding the first cavity assumes a larger cross section than the first cavity, this may increase the area of contact between the second semiconductor structure and the third semiconductor structure. Furthermore, overfilling the first cavity may ensure that the first cavity is completely filled by the second semiconductor structure.

According to an embodiment, the method further comprises planarizing the second insulator layer and the overfilled second semiconductor structure. In this embodiment, the second exposed surface is flush with the outer surface of the second insulator layer. This may ensure that the contact area between the second semiconductor structure and the third semiconductor structure equals the cross-sectional area of the first cavity and may thus yield a constant current density along the entire thickness of the second semiconductor structure. Furthermore, the planarization may yield a smooth and regular second exposed surface, which may reduce the parasitic resistance between the second semiconductor structure and the third semiconductor structure. The common planarization of the overfilled portion of the second semiconductor structure and the second insulator layer may be performed using a polishing process such as chemical-mechanical polishing (CMP).

According to an embodiment, the method further comprises, after the planarization, forming a recess of the second semiconductor structure into the first cavity, the recess having a predefined depth. The recession of the second semiconductor structure down to the predefined depth may be done using a selective or parametric etching technique, such as digital etching, that may allow for a controlled removal of full or fractional monolayers of the second semiconductor structure. This may have the advantage of enabling the formation of the second semiconductor structure with a well-defined, highly precise thickness (corresponding to channel length of the FET structure) as well as a clean second exposed surface formed by a monolayer.

According to an embodiment, the second exposed surface is located inside the first cavity. This may enable to position the transition between the second semiconductor structure and the third semiconductor structure at a well-defined, uniform distance from the gate structure. In operation, this may enable maintaining a constant current density at both sides of the transition. For instance, the second exposed surface may be formed by crystal growth of the second semiconductor structure as the surface the second semiconductor structure assumes when the growth process is finished, or by recessing the second semiconductor structure back into the first cavity as described before.

According to an embodiment, the second insulator layer extends from the first reference plane to a second reference plane, the second exposed surface being located between the first reference plane and the second reference plane. This may ensure that the third semiconductor structure is located at a non-zero distance from the gate structure.

According to an embodiment, the second semiconductor structure is free-standing within the second cavity. After removing the sacrificial layer, the second semiconductor structure may be freestanding so that the gate structure embeds the second semiconductor structure as a gate-all-around structure. A biased gate-all-around structure may attract charge carriers (i.e., electrons and holes) at all sides of the second semiconductor structure. This may provide an improved control over the charge carriers. In general, the transistor structure may be a multi-gate device where the gate structure adjoins two or more sides of the second semiconductor structure.

According to embodiments, the filling of the second cavity includes lining the second cavity with a gate insulator material, thus reducing the volume of the second cavity, and filling the reduced volume with a gate electrode material.

This may yield the possibility to implement an insulated-gate FET (IGFET) with the FET structure. In addition, the lining of the second cavity with the gate insulator material may provide an improved protection from spontaneous loss or generation of charge carriers through leak currents or tunneling. The lining may be achieved using a deposition technique such as conformal atomic layer deposition (ALD). Without limitation, the gate insulator material may comprise a high-k dielectric.

According to embodiments, the first semiconductor structure adjoins the substrate. This may provide the possibility to bias the first semiconductor structure via the substrate, so that it may be unnecessary to form an extra contacting structure for the first semiconductor structure. Furthermore, an electric contact between the first semiconductor structure and the substrate may enable a 'back-side' biasing of the first semiconductor structure at a time in the manufacturing process when no 'front-side' contacting structure, as it may be required for biasing the first semiconductor structure during regular operation, is available yet. This may be beneficial for applying a bias voltage to the first semiconductor structure that may be needed for initiating crystal growth of the second semiconductor structure on the first exposed surface of the first semiconductor structure.

According to embodiments, the insulator structure detaches the first semiconductor structure from the substrate. The first semiconductor structure may thus form an semiconductor-on-insulator (SOI) structure. In this way, an electrical insulation of the first semiconductor structure from the substrate may be established. This may contribute to a reduction of parasitic capacitance of the FET structure.

According to embodiments, the first semiconductor structure includes a planar surface, the first insulator layer covering the planar surface. As the gate structure is also formed on the planar surface provided by the first insulator layer, the first semiconductor structure is parallel to the gate structure. This may reduce or eliminate the overlap between the gate structure and the first semiconductor structure.

According to embodiments, the method further includes encapsulating the third semiconductor structure in an insulator shell. As the third semiconductor structure is formed on the second exposed surface of the second semiconductor structure, encapsulating means here that the third semiconductor structure is adjoined by no further electric (i.e., non-insulating) contact than the second semiconductor structure. This may provide the third semiconductor structure with an improved protection from the etchant used for removing the sacrificial layer.

According to embodiments, the extension of the third semiconductor structure in a reference direction parallel to the first reference plane is greater than the extension of the second semiconductor structure in the reference direction and smaller than the extension of the first semiconductor structure in the reference direction. The approach of structuring the first semiconductor structure larger than the third semiconductor structure may reserve a sufficient amount of space for contacting the first and the third semiconductor structure from the 'front side', i.e., using contacting structures such as vias that are arranged in the reference direction and run through the second insulator layer, but not through the substrate. The small dimensioning of the second semiconductor structure may warrant an efficient channel structure that enables a high degree of control over charge carriers residing in the second semiconductor structure using the gate structure.

According to embodiments, a reference axis runs through the first, the second and the third semiconductor structure, the largest extension of the first semiconductor structure perpendicular to the reference axis being oriented in a first direction, the largest extension of the gate structure perpendicular to the reference axis being oriented in a second direction, the second direction being different from the first direction. This structuring approach may also reserve a sufficient amount of space for contacting the first semiconductor structure and the gate structure from the 'front side', i.e., using contacting structures such as vias that are arranged in the first and second direction relative to the reference axis, respectively, and run through the second insulator layer, but not through the substrate. A suitable contacting structure for the third semiconductor structure may enclose the reference axis. It should be noted that the second direction may be parallel, but opposite to the first direction, such that contacting structures to be formed for the first and third semiconductor structures as well as the gate structure may be arranged in a line, but is also possible that the first and the second direction are not parallel so that a "three-dimensional" arrangement of contacting structures can be formed. Such non-parallel configuration may allow for a more efficient use of available space for contacting.

According to embodiments, the gate structure includes a gate electrode. The method further includes removing a portion of the second insulator layer and the gate structure, thus exposing a fourth exposed surface of the first insulator layer, covering the field-effect transistor structure and the fourth exposed surface with a third insulator layer, the third insulator layer extending between the field-effect transistor structure and a third reference plane, starting from the third reference plane, forming a first, a second and a third contact cavity, the first contact cavity exposing a portion of the first semiconductor structure, the second contact cavity exposing a portion of the gate electrode, the third contact cavity exposing a portion of the third semiconductor structure, the third insulator layer detaching the first contact cavity from the gate structure and detaching the second contact cavity from the third semiconductor structure, and filling the first, the second and the third contact cavity with a conductive material up to the third reference plane, the conductive material electrically contacting the respective exposed portion.

This approach to forming contacting structures to the first and third semiconductor structures and the gate structure may make an efficient use of the available space for contacting and may feature a comparably low complexity of manufacturing. For instance, the removal of the portion of the second insulator layer and the gate structure may be performed using a dry-etching process, while the contact cavities may be formed by lithographical patterning and subsequent etching. The step of filling the contact cavities may include overfilling one or more of the contact cavities. The conductive material may comprise a metal or any non-metallic material with a comparably high electric conductivity such as a doped semiconductor or a conductive ceramic like indium tin oxide (ITO).

According to embodiments, the first insulator layer and the second insulator layer comprise different materials. This may provide the advantage that the respective first and second insulator materials may be chosen to optimize specific desirable properties, such as providing an improved etch selectivity.

According to embodiments, the first semiconductor structure comprises an n-type semiconductor, the second semiconductor structure comprising an intrinsic semiconductor, the third semiconductor structure comprising a p-type semiconductor; or the first semiconductor structure comprises a p-type semiconductor, the second semiconductor structure comprising an intrinsic semiconductor, the third semiconductor structure comprising an n-type semiconductor. In both cases, this may result in the FET structure implementing a TFET structure. In this case, it may be possible to reach a subthreshold slope well below the classical limit of 60 mV/dec, which may result in a higher switching speed as well as a lower power consumption than would be possible with a MOSFET implementing thermal charge carrier generation.

According to embodiments, the first insulator layer, the second insulator layer and the sacrificial layer are made of an insulator material, the insulator material comprising either silicon dioxide or silicon nitride, the insulator material of the sacrificial layer being different from the insulator material of the first insulator layer and of the second insulator layer. This means that each of the first insulator layer, the second insulator layer and the sacrificial layer is made of either silicon dioxide ($SiO_2$) of silicon nitride (SiN), and together with the specification that the sacrificial layer be made of a different insulator material than the first insulator layer and the second insulator layer, it follows that the first insulator layer and the second insulator layer are made of the same insulator material. Hence, two cases are specified: Either the first insulator layer and the second insulator layer are made of $SiO_2$ and the sacrificial layer is made of SiN, or the first insulator layer and the second insulator layer are made of SiN and the sacrificial layer is made of $SiO_2$. In both cases, this may enable a selective removal of the sacrificial layer with a minimal removal of any other structures forming the FET structure, and/or an improved selectivity with respect to nucleation and epitaxial growth.

According to embodiments, the first, the second and the third semiconductor structure are made of a semiconductor material, the semiconductor material being selected, for each of the first, the second and the third semiconductor structure, from the group consisting of silicon, germanium, silicon-germanium, indium phosphide, indium arsenide, indium gallium arsenide, gallium arsenide, gallium antimonide, and gallium arsenide antimonide. With said materials, the field-effect transistor structure may be utilized to implement numerous types of FET devices. For instance, a TFET device may be implemented by several material combinations of which some are given here without limitation: Si/InAs (p-TFET); InGaAs/Si; InGaAs/InAs; Si/SiGe; InAs/GaAsSb/GaSb (n-TFET); InGaAs/InP; InGaAs; SiGe; Si. In this list, combinations of materials having different most abundant materials are indicated by a slash; where a slash is missing, the suggested materials have the same most abundant material but are differently doped.

Figure 9:
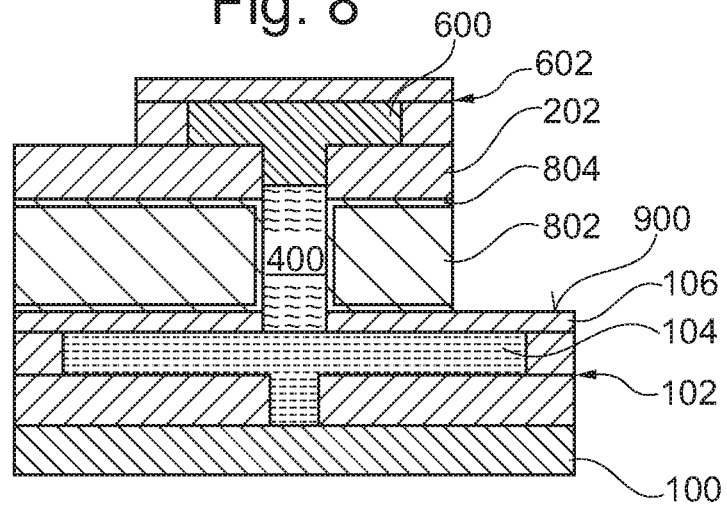
FIGS. 9-10 are cross-sectional views of an exemplary field-effect transistor structure at further fabrication stages, accordance with embodiments of the present disclosure.
Figure 10:
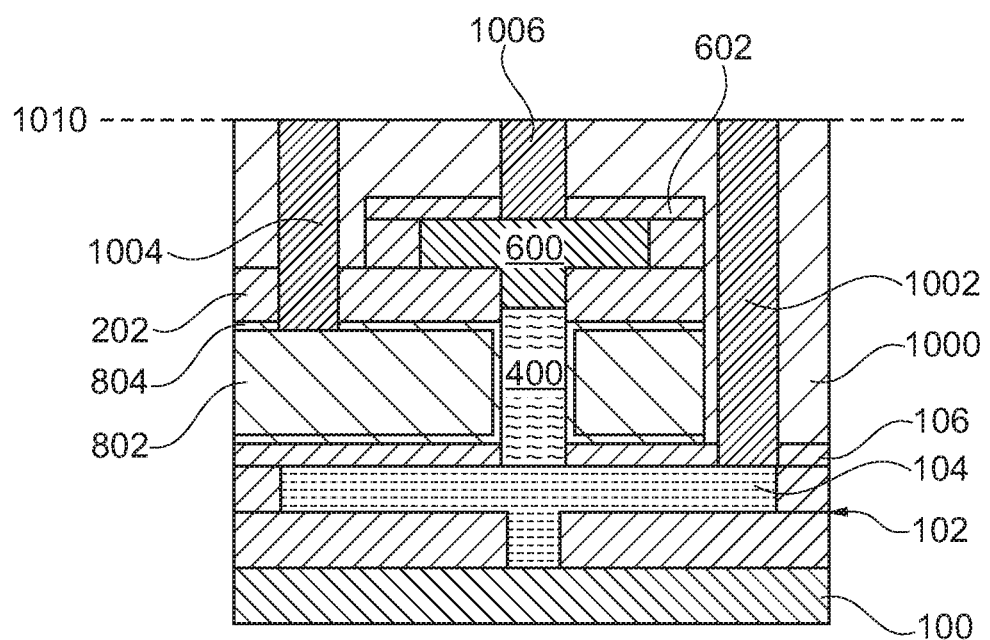
Figure 11:
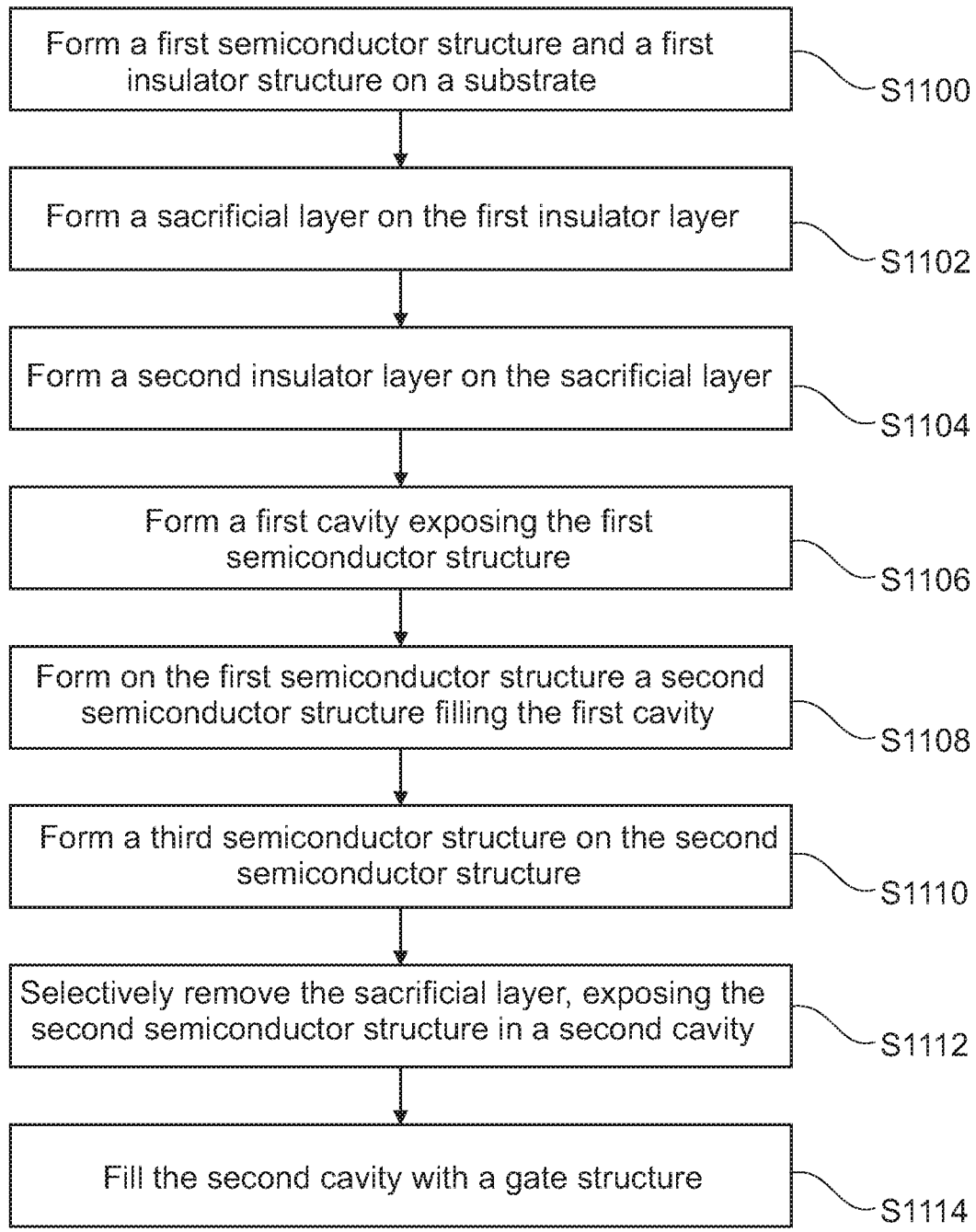
FIG. 11 visualizes a method for fabricating a field-effect transistor structure on a substrate, accordance with embodiments of the present disclosure.

Now turning to the drawings, FIGS. 1-10 are cross-sectional views of an exemplary field-effect transistor (FET) structure at different subsequent fabrication stages and FIG. 11 visualizes a method for fabricating a field-effect transistor structure on a substrate. Fabrication stages implemented by the method of FIG. 11 are part of the structures shown in FIGS. 1-8. It is pointed out that, although the drawings illustrate the fabrication stages of an FET structure where the first semiconductor structure, the second semiconductor structure and the third semiconductor structure are formed in a vertical arrangement, it is not excluded that a similar or identical FET structure may likewise be fabricated with a horizontal arrangement of the first semiconductor structure, the second semiconductor structure and the third semiconductor structure.

FIG. 1 illustrates a starting structure 102, 104, 106 that is formed on a substrate 100. The starting structure 102, 104, 106 comprises a first semiconductor structure 104 surrounded by an insulator structure 102, 106. The first semiconductor structure 104 may be manufactured by one or more of various suitable processes, including, but not limited to a formation as part of the substrate (e.g., silicon-on-insulator, SOI); deposition onto the substrate by a process such as wafer bonding; or direct growth onto the substrate by a process such as template-assisted selective epitaxy. The cross section of the first semiconductor structure 104 shown in the drawing is T-shaped with a short vertical segment adjoining the substrate 100 and a large horizontal segment separated from the substrate 100 by the insulator structure 102, 106. The planar upper surface of the first semiconductor structure 104 is covered by the first insulator layer 106, which is a portion of the insulator structure 102, 106. In a non-limiting example, the first semiconductor structure 104 is made of a doped semiconductor adapted for implementing a source region of the FET structure and the insulator structure 102, 106 is made of an electrically insulating oxide. Without limitation, the first semiconductor structure 104 and the insulator structure 102, 106 may be formed on the substrate 100 by a deposition technique combined with photolithographic patterning and etching.

It must be noted that the special case of a T-shaped first semiconductor structure 104 is shown here for the sole purpose of illustration. In general, there is no restriction to the geometry of the first semiconductor structure 104 but that the first insulator layer 106 is covering the first semiconductor structure 104 and that the starting structure 102, 104, 106 comprising the first semiconductor structure 104 and the insulator structure 102, 106 is formed on the substrate 100. In an example, the first semiconductor structure 104 comprises a layer that is formed between the insulator structure 102 and the first insulator layer 106 with a rectangular cross section and without a portion adjoining the substrate 100.

Figure 2:
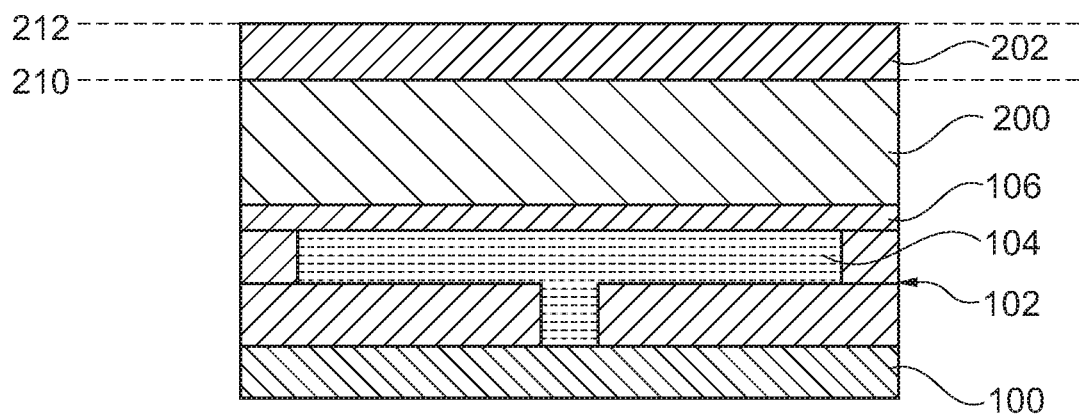

In FIG. 2, a sacrificial layer 200 has been formed on the first insulator layer 106 and a second insulator layer 202 has been formed on the sacrificial layer 200. The sacrificial layer 200 extends from the first insulator layer 106 to a first reference plane 210 and the second insulator layer 202 extends from the first reference plane 210 (i.e., from the upper surface of the sacrificial layer 200) to a second reference plane 212. The sacrificial layer 200 is made of a material that allows for a specific removal of the sacrificial layer 200 (e.g., by etching with a specific etchant) without affecting the remaining parts of the FET structure. In a non-limiting example, the second insulator layer 202 is made of an oxide that may be identical to or different from the material of the first insulator layer 106 and the sacrificial layer is made of an oxide that is different from the materials of the first insulator layer 106 and the second insulator layer 202.

Figure 3:
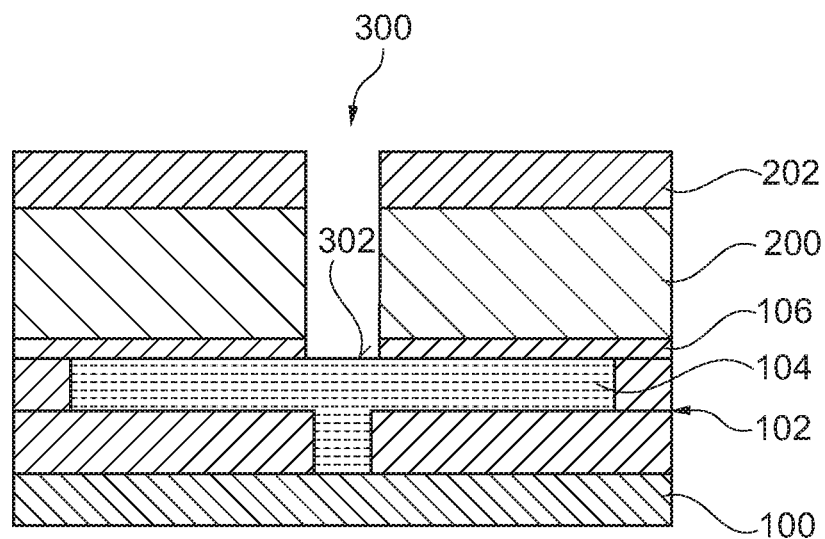

In FIG. 3, a first cavity 300 has been formed through the second insulator layer 202, the sacrificial layer 200 and the first insulator layer 106. The bottom of the first cavity 300 is formed by a first exposed surface 302 of the first semiconductor structure 104. In a non-limiting example, the first cavity 300 is formed by lithographical patterning and subsequent etching. In the depicted example, the first cavity 300 extends vertically into the surrounding materials and has a constant horizontal cross section.

Figure 4:
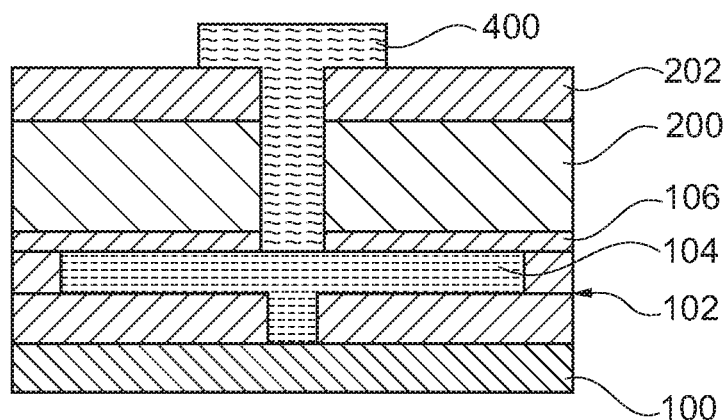

In FIG. 4, the first cavity 300 has been overfilled with a second semiconductor structure 400. The second semiconductor structure 400 adjoins the second exposed surface 302 of the first semiconductor structure 104, the first insulator layer 106, the sacrificial layer 200 and the second insulator layer 202. In a non-limiting example, is formed by a crystal growth process nucleating from the first exposed surface 302 of the biased first semiconductor structure 104. The semiconductor material of the second semiconductor structure 400 may differ from the semiconductor material of the first semiconductor structure 104 by the species of its most abundant material or by the species or concentration of any less abundant material.

Figure 5:
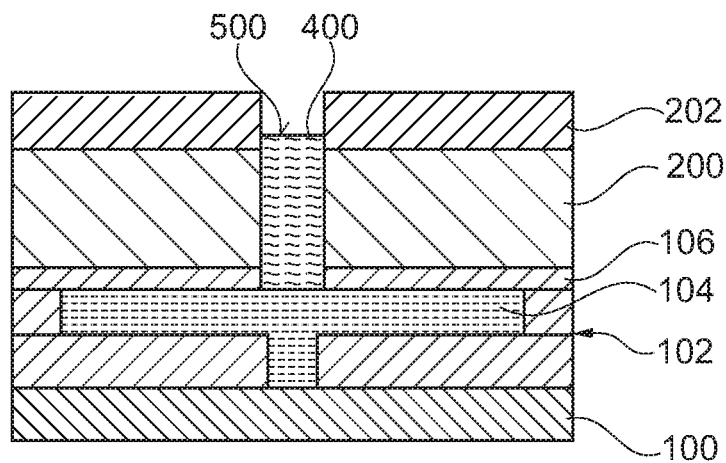

In FIG. 5, the second semiconductor structure 400 has been recessed into the first cavity 300 and now features a second exposed surface 500 that is located between the first reference plane 210 and the second reference plane 212. In a non-limiting example, the recess is formed by removing any excess material of the second semiconductor structure 400 from the upper surface of the second insulator layer 202 (i.e., any material located above the second reference plane 212) by chemical-mechanical polishing (CMP) of the second insulator layer 202 and subsequent digital etching of a predefined number of monolayers of the second semiconductor structure 400.

Figure 6:
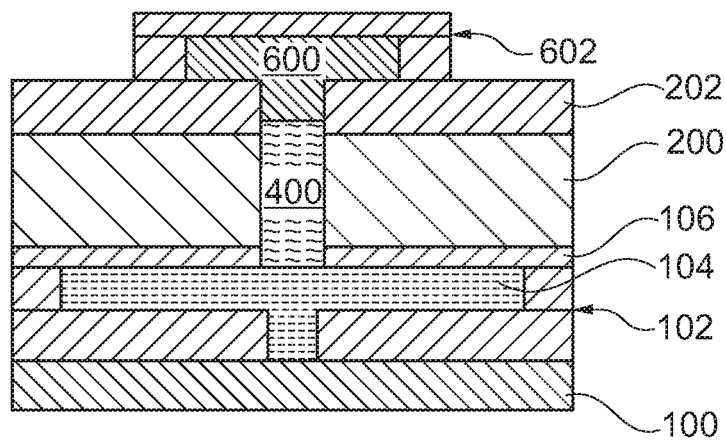

In FIG. 6, the second exposed surface 500 has been covered by a third semiconductor structure 600. The third semiconductor structure 600 has a T-shaped cross section with a short vertical portion adjoining the second exposed surface 500 of the second semiconductor structure 400 and a longer horizontal portion second insulator layer 202 overfilling the first cavity 300. The length (measured in the left-to-right direction in the drawing) of the vertical portion of the third semiconductor structure 600 is smaller than the length of the vertical portion of the first semiconductor structure 104 and larger than the length of the second semiconductor structure 400. The semiconductor material of the third semiconductor structure 600 may differ from the semiconductor material of the second semiconductor structure 400 by the species of its most abundant material or by the species or concentration of any less abundant material. The free portion of the surface of the third semiconductor structure 600 (i.e., the portion that is neither adjoining the second insulator layer 202 nor the second semiconductor structure 400) is encapsulated in an insulator shell 602. The insulator shell 602 is made of an electrically insulating material that may be identical to or different from the respective materials of the insulator structure 102 and/or the first insulator layer 106 and/or the second insulator layer 202.

In a non-limiting example, the first semiconductor structure 102, the second insulator layer 202 and the insulator shell 602 are made of silicon dioxide and the sacrificial layer 200 is made of silicon nitride. This combination may allow for a specific removal of the sacrificial layer 200 while the first semiconductor structure 104 and the third semiconductor structure 600 are protected from the specific etchant for removing the sacrificial layer 200 by the first semiconductor structure 104, the second semiconductor structure 400, and the third semiconductor structure 600. Alternatively, it may be possible to fabricate the FET structure without the insulator shell 602 if the material chosen for the third semiconductor structure 600 is insensitive to the specific etchant for removing the sacrificial layer 200. Without limitation, the third semiconductor structure 600 may be formed on the second exposed surface 400 by a crystal growth process or a deposition technique with subsequent photolithographic patterning and etching.

Figure 7:
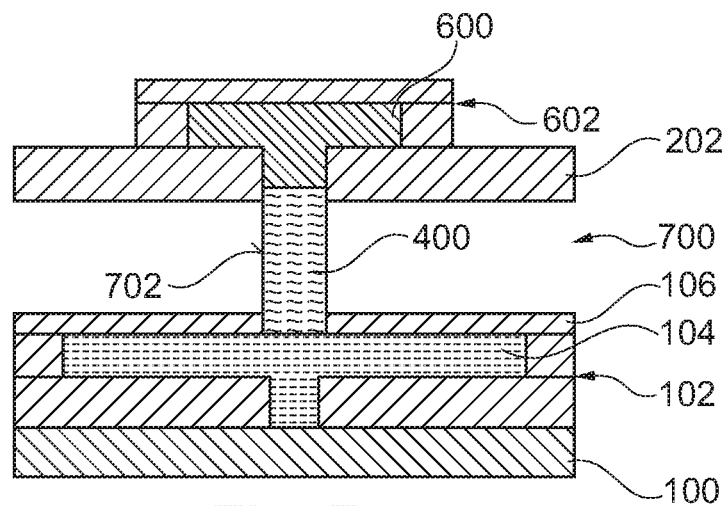

In FIG. 7, the sacrificial layer 200 has been removed using, e.g., a selective etching process. The other structures formed from FIG. 1 to FIG. 6 remain unaffected by the removal. The portion of the second semiconductor structure 400 that is not adjoining the first semiconductor structure 104, the first insulator layer 106, the second semiconductor structure 400 or the second insulator layer 202 now exposes a third exposed surface 702 to the second cavity 700. Further walls of the second cavity 700 are formed by the lower surface of the second insulator layer 202 and the upper surface of the first insulator layer 106. Although not excluded, the presentation of FIG. 7 does not necessarily imply that the exposed part of the second semiconductor structure 400 is freestanding within the second cavity 700.

Figure 8:
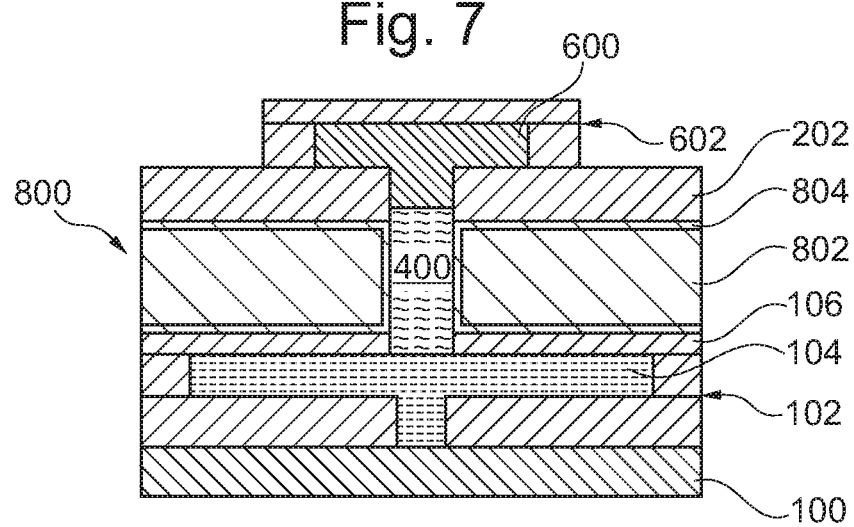

In FIG. 8, the second cavity 700 has been filled with a gate structure 802, 804 that comprises a gate electrode 802 and a gate insulator layer 804 interfacing the gate electrode 802 and the walls of the second cavity 700 formed by the third exposed surface 702 of the second semiconductor structure 400, the lower surface of the second insulator layer 202 and the upper surface of the first insulator layer 106. Said arrangement of structures comprises the FET structure 800 formed by the method for fabricating a field-effect transistor structure on a substrate illustrated in FIG. 11. The gate electrode 802 may be made of a metal or another electrically conductive material. The gate insulator layer 804 may be made of an electrical insulator including, but not limited to, a high-k dielectric. Without limitation, the gate structure 802, 804 may be formed within the second cavity 700 by conformal atomic layer deposition (ALD).

FIGS. 9 and 10 illustrate further fabrication stages that go beyond the fabrication of the FET structure 800. In FIG. 9, the second insulator layer 202 and the gate structure 802, 804 are partially removed on the right side of the drawing so that a horizontal fourth exposed surface 900 of the first insulator layer 106 as well as a vertical surface of the gate structure 802, 804 that is flush with the right wall of the insulator shell 602 encapsulating the third semiconductor structure 600 are formed. Without limitation, the removal may be performed with a dry-etching process. The other structures formed from FIG. 1 to FIG. 8 remain unaffected by the removal.

In FIG. 10, the FET structure 800 and the fourth exposed surface 900 have been covered with a third insulator layer 1000 that respectively extends from the fourth exposed surface 900, the upper side of the second insulator layer 202 and the upper side of the insulator shell 602 to a third reference plane 1010. The third insulator layer 1000 comprises vias 1002, 1004, 1006 that are made of a metal or another electrically conductive material filling out contact cavities. Via 1002 extends between the third reference plane 1010 and the first semiconductor structure 104 and is adapted for electrically contacting the first semiconductor structure 104 from the third reference plane 1010, via 1004 extends between the third reference plane 1010 and the gate electrode 802 and is adapted for electrically contacting the gate electrode 802 from the third reference plane 1010, and via 1006 extends between the third reference plane 1010 and the third semiconductor structure 600 and is adapted for electrically contacting the third semiconductor structure 600 from the third reference plane 1010. The third insulator layer 1000 separates via 1002 from the vertical wall of the gate structure 802, 804 and separates via 1004 from the insulator shell 602. In an alternative FET structure formed without an insulator shell 602, the third insulator layer 1000 would separate the third semiconductor structure 600 from via 1002 and via 1004.

FIG. 11 is a flow diagram illustrating a method for fabricating a field-effect transistor structure 800 on a substrate 100. The method starts with forming S1100 a starting structure 102, 104, 106 on the substrate 100, wherein the starting structure comprises a first semiconductor structure 104 and an insulator structure 102, 106. A first insulator layer 106 of the insulator structure 102, 106 covers the first semiconductor structure 104. Next, a sacrificial layer 200 is formed S1102 on the first insulator layer 106 and a second insulator layer 202 is formed S1104 on the sacrificial layer 200. The sacrificial layer 200 extends between the first insulator layer 106 and a first reference plane 210, while the second insulator layer 202 extends between the sacrificial layer 200 (i.e., the first reference plane 210) and a second reference plane 212.

A first cavity 300 is formed S1006 through the second insulator layer 202, the sacrificial layer 200 and the first insulator layer 106 so that a first exposed surface 302 of the first semiconductor structure 104 is exposed. On the first exposed surface 302, a second semiconductor structure 400 is formed S1108 such that it fills the first cavity 300 from the first exposed surface 302 at least up to the first reference plane 210. The second semiconductor structure 400 comprises a second exposed surface 500 that does not adjoin any other structure formed so far. On the second exposed surface 500, a third semiconductor structure 600 is formed S1110.

Then, the sacrificial layer 200 is selectively removed S1112, i.e., the structures apart from the sacrificial layer 200 remain substantially intact by the removal. The volume previously filled by the sacrificial layer 200 now forms a second cavity 700 through which a third exposed surface 702 of the second semiconductor structure 400 is accessible. Eventually, the FET structure 800 is formed by filling S1114 the second cavity 700 with a gate structure that may, without limitation, comprise a conductive gate electrode 802 and a gate insulator layer 804 that insulates the second semiconductor structure 400 from the gate electrode 802.

What is claims is:

1. A method for fabricating a field-effect transistor structure on a substrate, the method comprising:
    forming a starting structure on the substrate, the starting structure comprising a first semiconductor structure and an insulator structure, the insulator structure covering the first semiconductor structure with a first insulator layer;
    forming a sacrificial layer on the first insulator layer, the sacrificial layer extending between the first insulator layer and a first reference plane;
    forming a second insulator layer on the first reference plane;
    forming a first cavity through the second insulator layer, the sacrificial layer and the first insulator layer, thus exposing a first exposed surface of the first semiconductor structure;
    filling the first cavity with a second semiconductor structure at least up to the first reference plane using a crystal growth process, thus covering the first exposed surface with the second semiconductor structure, the second semiconductor structure having a second exposed surface, wherein a distance between the first exposed surface and the second exposed surface is greater than a second distance between the first exposed surface and the first reference plane;
    forming a third semiconductor structure on the second exposed surface, wherein an extension of the third semiconductor structure in a reference direction parallel to the first reference plane being greater than an extension of the second semiconductor structure in the reference direction and smaller than an extension of the first semiconductor structure in the reference direction to reserve a space for contacting the third semiconductor structure using a via arranged in the reference direction;
    selectively removing the sacrificial layer, thus forming a second cavity and exposing a third exposed surface of the second semiconductor structure;
    filling the second cavity with a gate structure, thus covering the third exposed surface with the gate structure, and
    detaching, by the insulator structure, the first semiconductor structure from the substrate forming a semiconductor-on-insulator structure that establishes an electrical insulation of the first semiconductor structure from the substrate.

2. The method of claim 1, the filling of the first cavity comprising overfilling the first cavity with the second semiconductor structure.

3. The method of claim 2, further comprising planarizing the second insulator layer and the overfilled second semiconductor structure.

4. The method of claim 3, further comprising, after the planarization, forming a recess of the second semiconductor structure into the first cavity, the recess having a predefined depth.

5. The method of claim 1, the second exposed surface being located inside the first cavity.

6. The method of claim 5, the second insulator layer extending from the first reference plane to a second reference plane, the second exposed surface being located between the first reference plane and the second reference plane.

7. The method of claim 1, the second semiconductor structure being free-standing within the second cavity.

8. The method of claim 1, the filling of the second cavity comprising:
    lining the second cavity with a gate insulator material, thus reducing a volume of the second cavity; and
    filling the reduced volume with a gate electrode material.

9. The method of claim 1, the first semiconductor structure adjoining the substrate.

10. The method of claim 1, the first semiconductor structure comprising a planar surface, the first insulator layer covering the planar surface.

11. The method of claim 1, further comprising encapsulating the third semiconductor structure in an insulator shell.

12. The method of claim 1, wherein a reference axis runs through the first, the second and the third semiconductor structure, the largest extension of the first semiconductor structure perpendicular to the reference axis being oriented in a first direction, the largest extension of the gate structure perpendicular to the reference axis being oriented in a second direction, the second direction being not parallel to the first direction.

13. The method of claim 1, the gate structure comprising a gate electrode, the method further comprising:
    removing a portion of the second insulator layer and the gate structure, thus exposing a fourth exposed surface of the first insulator layer;
    covering the field-effect transistor structure and the fourth exposed surface with a third insulator layer, the third insulator layer extending between the field-effect transistor structure and a third reference plane;
    starting from the third reference plane, forming a first, a second and a third contact cavity, the first contact cavity exposing a portion of the first semiconductor structure, the second contact cavity exposing a portion of the gate electrode, the third contact cavity exposing a portion of the third semiconductor structure, the third insulator layer detaching the first contact cavity from the gate structure and detaching the second contact cavity from the third semiconductor structure; and
    filling the first, the second and the third contact cavity with a conductive material up to the third reference plane, the conductive material electrically contacting the respective exposed portion.

14. The method of claim 1, the first insulator layer and the second insulator layer comprising different materials.

15. The method of claim 1, the first semiconductor structure comprising an n-type semiconductor, the second semiconductor structure comprising an intrinsic semiconductor, the third semiconductor structure comprising a p-type semiconductor; or
    the first semiconductor structure comprising a p-type semiconductor, the second semiconductor structure comprising an intrinsic semiconductor, the third semiconductor structure comprising an n-type semiconductor.

16. The method of claim 1, the first insulator layer, the second insulator layer and the sacrificial layer being made of an insulator material, the insulator material comprising either silicon dioxide or silicon nitride, the insulator material of the sacrificial layer being different from the insulator material of the first insulator layer and of the second insulator layer.

17. The method of claim 1, the first, the second and the third semiconductor structure being made of a semiconductor material, the semiconductor material being selected, for each of the first, the second and the third semiconductor structure, from the group consisting of silicon, germanium, silicon-germanium, indium phosphide, indium arsenide, indium gallium arsenide, gallium arsenide, gallium antimonide, and gallium arsenide antimonide.

* * * * *